(12) United States Patent  
Erisman et al.

(10) Patent No.: US 9,395,407 B2  
(45) Date of Patent: Jul. 19, 2016

(54) ENHANCED DYNAMIC RANGE RF PULSE MEASUREMENT SYSTEM

(71) Applicant: X-COM SYSTEMS, LLC, Reston, VA (US)

(72) Inventors: David E. Erisman, Warrensburg, MO (US); Troy D. Calderwood, Wellsville, KS (US); Marty R. Mosier, Woodbridge, VA (US)

(73) Assignee: X-COM SYSTEMS, LLC, Reston, VA (US)

( * ) Notice: Subject to any disclaimer, the term of this patent is extended or adjusted under 35 U.S.C. 154(b) by 15 days.

(21) Appl. No.: 14/244,409

(22) Filed: Apr. 3, 2014

(65) Prior Publication Data

US 2015/0285848 A1    Oct. 8, 2015

(51) Int. Cl.  
*G01R 23/00* (2006.01)  
*G01R 31/28* (2006.01)  
*G01R 33/00* (2006.01)

(52) U.S. Cl.  
CPC ............ *G01R 31/2822* (2013.01); *G01R 33/00* (2013.01)

(58) Field of Classification Search  
USPC ................................ 324/76.19, 76.11, 76.12  
See application file for complete search history.

(56) References Cited

U.S. PATENT DOCUMENTS

| | | | | |
|---|---|---|---|---|
| 4,199,760 A | * | 4/1980 | French | G01S 11/08 342/458 |
| 4,590,477 A | * | 5/1986 | Regnier | G01S 13/785 342/173 |
| 5,243,415 A | * | 9/1993 | Vance | H04N 5/38 348/462 |
| 6,720,908 B1 | * | 4/2004 | Puglia | G01S 13/44 342/113 |
| 7,184,493 B1 | * | 2/2007 | Pringle | G01S 7/021 342/111 |
| 7,317,930 B2 | * | 1/2008 | Ikeda | H04N 5/28 455/39 |
| 2006/0057997 A1 | * | 3/2006 | Hausdorf | G01R 19/04 455/264 |
| 2007/0025691 A1 | * | 2/2007 | Shoji | G11B 27/105 386/353 |
| 2008/0091350 A1 | * | 4/2008 | Smith | G01C 21/165 701/472 |
| 2011/0288823 A1 | | 11/2011 | Gupta | |

* cited by examiner

*Primary Examiner* — Tung X Nguyen  
*Assistant Examiner* — Giovanni Astacio-Oquendo  
(74) *Attorney, Agent, or Firm* — Wegman, Hessler & Vanderburg

(57) ABSTRACT

The enhanced dynamic range RF pulse measurement system accepts an RF source for spectral analysis. The system includes an RF splitter accepting the RF source under analysis as input. The split output connects to identical precision timing insertion units (TIU) 1 and 2, each time tagging its respective RF signal stream. TIU 1 feeds a first real-time spectrum analyzer (RSA 1) set for strong signals at an exemplary −3.00 dBm reference level. TIU 2 feeds a second real-time spectrum analyzer (RSA 2) set for weak signals at an exemplary −15.00 dBm reference level. Outputs of RSA 1 and RSA 2 are then fed to a multi-channel recorder which records the respective time tagged RF signal streams. For each signal stream real-time PDW processing is performed. Output of the recorder feeds a workstation that for any given time tag selects and processes the channel having the highest quality signal.

15 Claims, 13 Drawing Sheets

Pulse Search Results

Search Type: Pulse
Number of results: 120

| Peak Power | Avg Power | Start Time | Width | PRI | Rise Time | Fall Time | Frequency |
|---|---|---|---|---|---|---|---|
| -2.39 dBm | -2.45 dBm | 1.292 msec | 20.000 usec | 0.0 sec | 63.958 nsec | 63.542 nsec | -40.0063 MHz |
| -6.38 dBm | -6.47 dBm | 1.792 msec | 20.000 usec | 500.000 usec | 63.750 nsec | 63.333 nsec | -35.0104 MHz |
| -10.34 dBm | -10.45 dBm | 2.292 msec | 19.987 usec | 500.007 usec | 63.958 nsec | 63.125 nsec | -29.9984 MHz |
| -14.30 dBm | -14.47 dBm | 2.792 msec | 19.987 usec | 500.000 usec | 65.000 nsec | 62.708 nsec | -25.0018 MHz |
| -18.23 dBm | -18.50 dBm | 3.292 msec | 19.973 usec | 500.007 usec | 63.333 nsec | 62.083 nsec | -20.0005 MHz |
| -22.12 dBm | -22.50 dBm | 3.792 msec | 19.967 usec | 500.007 usec | 65.417 nsec | 63.333 nsec | -9.9996 MHz |
| -25.88 dBm | -26.52 dBm | 4.292 msec | 19.940 usec | 500.013 usec | 63.333 nsec | 68.333 nsec | -5.0002 MHz |
| -29.41 dBm | -30.52 dBm | 4.792 msec | 19.907 usec | 500.020 usec | 64.167 nsec | 63.333 nsec | 418.62 Hz |
| -33.15 dBm | -34.52 dBm | 5.292 msec | 19.873 usec | 500.020 usec | 45.417 nsec | 40.833 nsec | 4.9988 MHz |
| -2.37 dBm | -2.45 dBm | 8.792 msec | 20.000 usec | 3.500 msec | 63.958 nsec | 64.167 nsec | -40.0062 MHz |
| -6.34 dBm | -6.47 dBm | 9.292 msec | 20.000 usec | 500.000 usec | 64.375 nsec | 63.125 nsec | -34.9643 MHz |
| -10.32 dBm | -10.45 dBm | 9.792 msec | 19.987 usec | 500.007 usec | 63.333 nsec | 63.333 nsec | -30 MHz |
| -14.30 dBm | -14.47 dBm | 10.292 msec | 19.987 usec | 500.000 usec | 62.708 nsec | 63.750 nsec | -25.0015 MHz |
| -18.23 dBm | -18.49 dBm | 10.792 msec | 19.973 usec | 500.007 usec | 64.167 nsec | 62.917 nsec | -20.0002 MHz |
| -22.05 dBm | -22.50 dBm | 11.292 msec | 19.960 usec | 500.007 usec | 65.833 nsec | 67.083 nsec | -10.0001 MHz |
| -25.93 dBm | -26.52 dBm | 11.792 msec | 19.947 usec | 500.013 usec | 64.167 nsec | 74.583 nsec | -4.9999 MHz |
| -29.62 dBm | -30.53 dBm | 12.292 msec | 19.913 usec | 500.013 usec | 55.417 nsec | 49.583 nsec | -1.6739 kHz |
| -33.05 dBm | -34.51 dBm | 12.792 msec | 19.840 usec | 500.047 usec | 69.167 nsec | 70.000 nsec | 4.9992 MHz |
| -2.38 dBm | -2.45 dBm | 16.292 msec | 20.000 usec | 3.500 msec | 63.958 nsec | 64.375 nsec | -40.007 MHz |
| -6.39 dBm | -6.47 dBm | 16.792 msec | 20.000 usec | 500.000 usec | 63.542 nsec | 63.542 nsec | -34.9623 MHz |
| -10.34 dBm | -10.45 dBm | 17.292 msec | 19.987 usec | 500.007 usec | 63.125 nsec | 64.375 nsec | -29.996 MHz |
| -14.29 dBm | -14.46 dBm | 17.792 msec | 19.987 usec | 500.000 usec | 63.750 nsec | 63.333 nsec | -25.0010 MHz |
| -18.20 dBm | -18.49 dBm | 18.292 msec | 19.973 usec | 500.007 usec | 62.917 nsec | 60.833 nsec | -20.0001 MHz |
| -22.11 dBm | -22.50 dBm | 18.792 msec | 19.967 usec | 500.007 usec | 66.667 nsec | 64.583 nsec | -9.9978 MHz |
| -25.87 dBm | -26.51 dBm | 19.292 msec | 19.947 usec | 500.007 usec | 66.250 nsec | 62.917 nsec | -4.9993 MHz |

Sort

Parameter: Peak power

Direction: ● Increasing ○ Decreasing

[Sort] [Undo]

[Save To File]

*Fig. 12*

ENHANCED DYNAMIC RANGE RF PULSE MEASUREMENT SYSTEM

BACKGROUND OF THE INVENTION

1. Field of the Invention

The present invention relates to the measurement of digital radio frequency emissions, and particularly to an enhanced dynamic range RF pulse measurement system.

2. Description of the Related Art

When analyzing the Radio Frequency (RF) environment and RF signals, it is often necessary to accurately measure and record very low level RF signals in the presence of much higher level signals. Relative power levels can be as high as 70 decibels (dB), which, in power level terms, represents a range of over 10 million to one. This high instantaneous dynamic range can make it extremely difficult or impossible with currently available technology and test equipment to make precision power, frequency, signal characteristic, time and other measurements over such a large power range.

This challenge is compounded when the nature of the signals being analyzed includes RF pulses or other complex waveforms that have very fast rise and fall times, short durations, and/or rapidly varying power and/or frequency characteristics that must be captured and not distorted by the analysis system. This can simultaneously impose requirements for high instantaneous RF bandwidth capabilities that can be hundreds of Mega-Hertz (MHz) or more for many modern signals.

The laws of physics dictate that the amount of noise (thermal noise and noise from other sources) increases with instantaneous RF bandwidth. This noise is always unavoidably captured by all systems, along with desired signals. Background noise establishes a "noise floor" that serves to limit the maximum possible system analysis dynamic range. This noise floor can make it impossible to simultaneously achieve the signal analysis dynamic range and signal analysis instantaneous RF bandwidth needed to accurately measure the desired signal parameters. As a result, accurate measurements often cannot be made without highly undesirable compromises that can unacceptably limit system performance.

Thus, an enhanced dynamic range RF pulse measurement system solving the aforementioned problems is desired.

SUMMARY OF THE INVENTION

The enhanced dynamic range RF pulse measurement system accepts a wide range of radio frequency (RF) signals for analysis, while addressing the dynamic range vs. noise by using two or more separate RF receiving, sampling and recording systems, which simultaneously and in parallel monitor the same RF spectrum. Analyzer reference levels are individually set for different segments of the desired total system dynamic range. For example, in a dual-channel implementation, a first spectrum analyzer's reference level is set for high level RF signals, while a second spectrum analyzer's reference level is set for low level RF signals. The multiple receiving, sampling and recording systems divide the desired overall system dynamic range into a number of signal power segments that, when combined, cover the overall system level dynamic range needs. The individual receiving, digitizing and recording systems can be very different in their architectures, modes of operation, components, gain setting, capture bandwidths, etc., as needed for preferable performance settings over the desired dynamic range segment. The enhanced dynamic range RF pulse measurement system offers the capability to simultaneously achieve very high dynamic range (up to 70 dB or more) and wide RF analysis bandwidth (up to 100 MHz or more)

These and other features of the present invention will become readily apparent upon further review of the following specification and drawings.

BRIEF DESCRIPTION OF THE DRAWINGS

FIG. 12 is a screenshot showing typical pulse descriptor word (PDW) measurements on the RF pulse data in an enhanced dynamic range RF pulse measurement system according to the present invention.

Similar reference characters denote corresponding features consistently throughout the attached drawings.

DETAILED DESCRIPTION OF THE PREFERRED EMBODIMENTS

At the outset, it should be understood by one of ordinary skill in the art that methods performed by the present system can comprise software or firmware code executing on a computer, a microcontroller, a microprocessor, or a DSP processor; state machines implemented in application specific or programmable logic; or numerous other forms without departing from the spirit and scope of the method described herein. Methods performed by the present system can be provided as a computer program, which includes a non-transitory machine-readable medium having stored thereon instructions that can be used to program a computer (or other electronic devices) to perform a process according to the method. The machine-readable medium can include, but is not limited to, floppy diskettes, optical disks, CD-ROMs, and magneto-optical disks, ROMs, RAMs, EPROMs, EEPROMs, magnetic or optical cards, flash memory, or other type of media or machine-readable medium suitable for storing electronic instructions.

Figure 1:
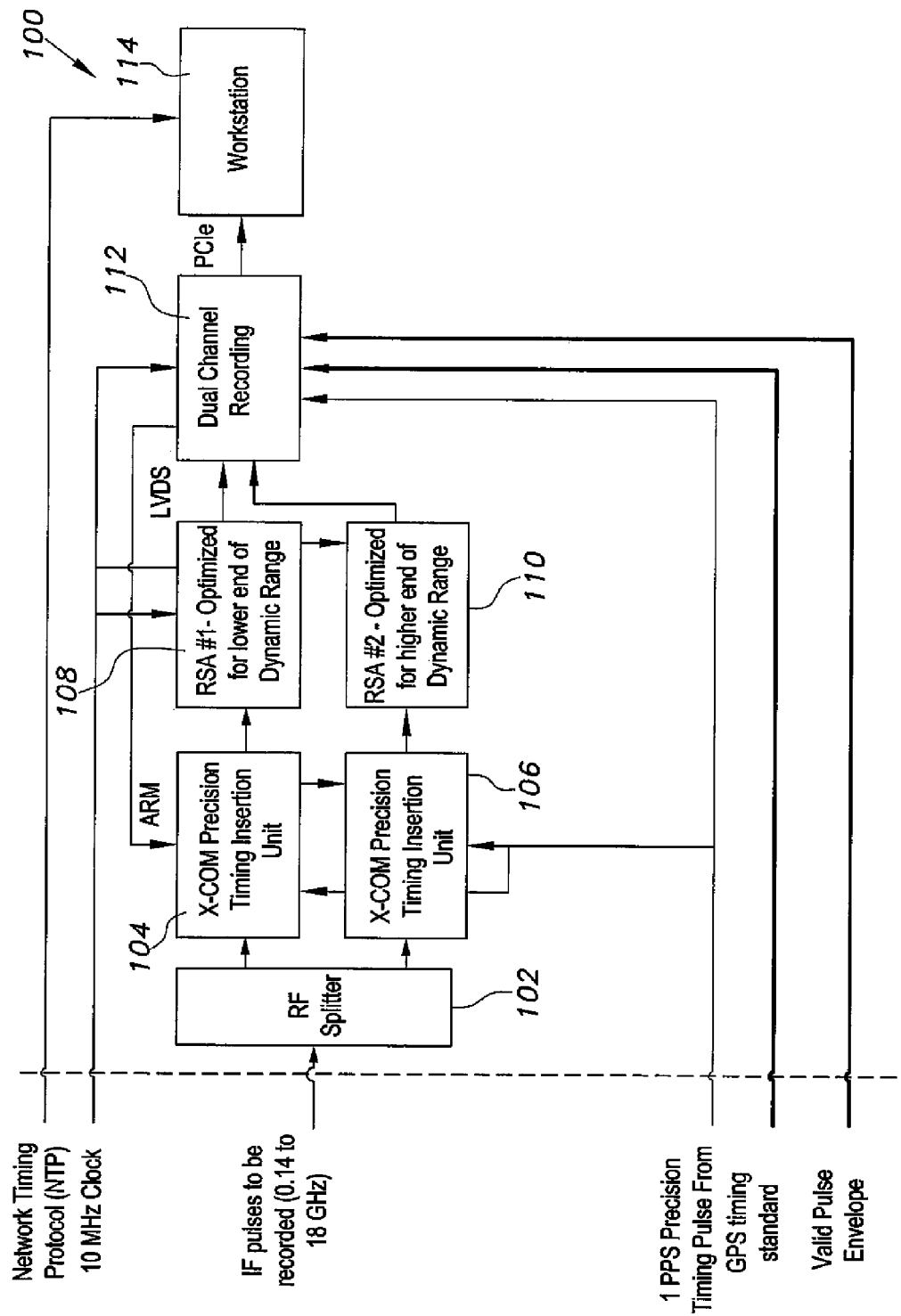
FIG. 1 is a block diagram of an enhanced dynamic range RF pulse measurement system according to the present invention.
Figure 15:
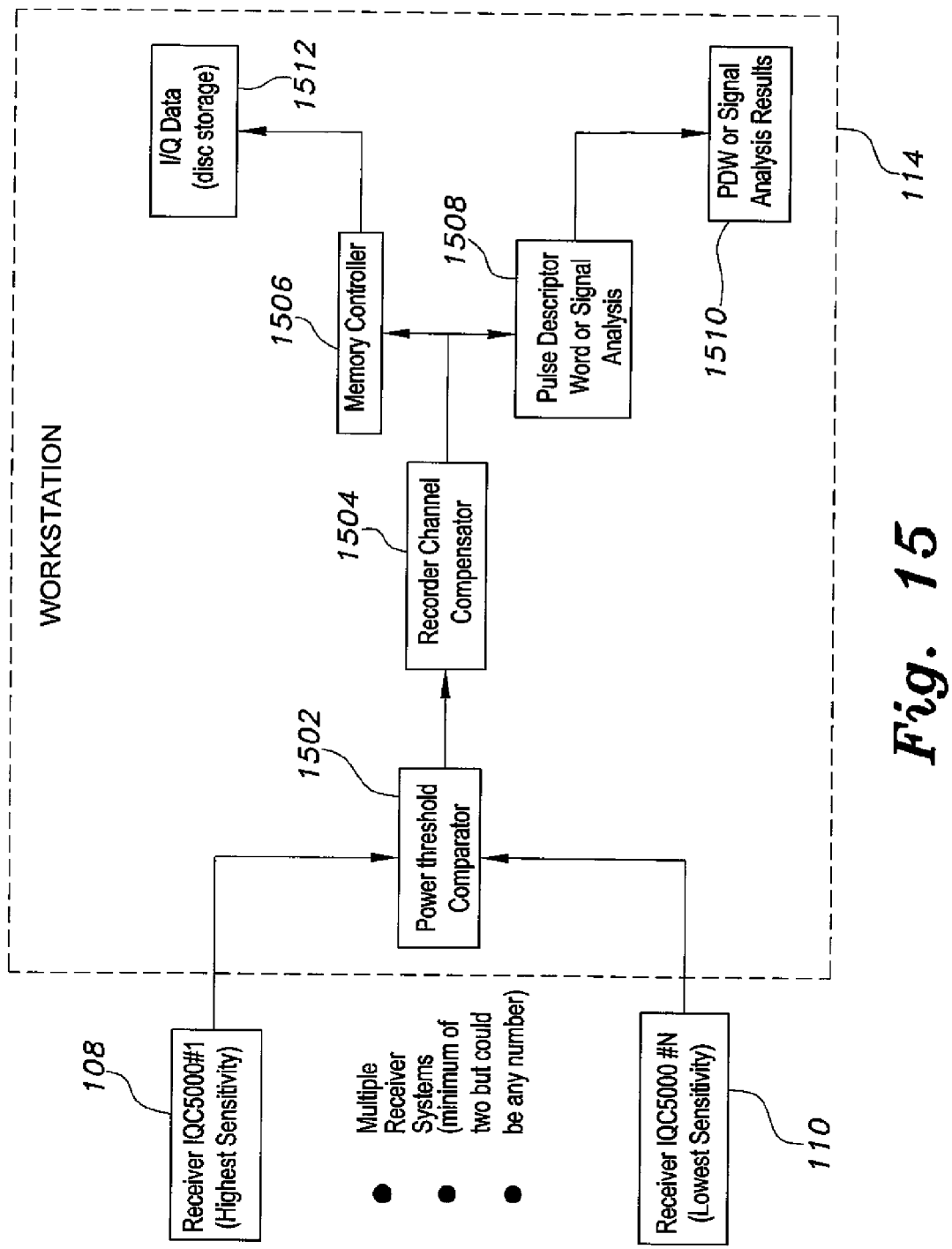
FIG. 15 is a block diagram of a workstation used in an enhanced dynamic range RF pulse measurement system according to the present invention.

As shown in FIG. 1, the enhanced dynamic range RF pulse measurement system 100 accepts an RF (radio frequency) source for spectral analysis. The system includes an RF splitter 102 accepting the RF source under analysis as input. The split output from the splitter 102 connects to identical precision timing insertion units (TIU 1) 104 and (TIU 2) 106, each unit 104, 106 time-tagging its respective RF signal stream. TIU 1 104 feeds a first real-time spectrum analyzer (RSA 1) 108 set for strong signals at an exemplary −3.00 dBm reference level. TIU 2 106 feeds a second real-time spectrum analyzer (RSA 2) 110 set for weak signals at an exemplary −15.00 dBm reference level. Low voltage differential signal (LVDS) I+Q outputs of the two spectrum analyzers 108, 110 are then fed to a multi-channel recorder 112, which records the respective time-tagged RF signal streams. For each signal stream, real-time PDW processing is performed by the recorder 112. The exemplary recorder 112 is a Field Programmable Gate Array (FPGA) that is programmed to perform real-time Pulse Descriptor Word (PDW) radar data processing for each pulse received for each channel. PDW processing performed by the recorder 112 includes the determination of Peak Power, Average Power, Start Time, Duration, Pulse Repetition Interval (PRI) and Pulse Count. The output of the recorder 112 feeds a workstation 114 (e.g., without limitation, via a PCIe bus) that selects and processes the channel having the highest quality signal for any given time tag. The workstation 114 uses direct (in-phase) and quadrature (I&Q) information passed from the recorder 112 to select which channel has the highest quality signal data. Moreover, the workstation 114 processes remaining PDW information, such as Rise Time, Fall Time, Beginning, Middle, and End Frequency, and the like. A network timing signal can be periodically sent to the workstation 114 to synchronize its clock with the timing of other components of the enhanced dynamic range RF pulse measurement system 100. With respect to workstation processing, as shown in FIG. 15, data output from the channel receivers 108 and 110 is fed to a power threshold comparator 1502. The output of power threshold comparator 1502 is fed to a recorder channel compensator 1504. The output of recorder channel compensator 1504 is fed to memory controller 1506 and pulse descriptor word or single analyses block 1508. The analysis results are captured in PDW or signal analysis results block 1510. The memory controller routes the I/Q data to storage at block 1512.

Operations of the RSAs 108, 110 and the recorder 112 utilize a time base provided by a clock, for example without limitation, a 10 MHz clock. A valid pulse envelope signal line input to the recorder 112 assures that the recorder 112 will record a pulse signal only when the valid pulse envelope signal is received by the recorder 112. A precision time code, such as an IRIG-B modulated carrier, is propagated through the system 100 via input to the recorder 112. The recorder 112 has control circuitry and/or programming that gates the TIUs 104 and 106, allowing them to insert the TRIG-B modulated carrier into the RF signal streams at user-determined precision time intervals. One possible gate timer is a 1 PPS precision timing pulse, which can be input to the TIUs 104 and 106 and the dual channel recorder 112 from an external source such as, for example without limitation, a Timing Solutions TSC 4400 source. Responsive to each precision timing pulse, the TIUs 104 and 106 insert the TRIG-B modulated carrier signal into the RF signal streams. The workstation 114 can use the RF signal streams and associated IRIG-B information to construct a time-contiguous file having the highest quality pulse signals captured, selecting from either RSA 1 108 or RSA 2 110 as determined by quality criteria programmed in the workstation 114.

The gain settings and other settings for each of the spectrum analyzers are set for different segments of the desired total system dynamic range. For example, the user may set the reference level for RSA 1 108 to faithfully capture high level RF signals, e.g., −40 to +10 dBm. The user may then set the reference level of RSA 2 110 to faithfully capture low level RF signals, e.g., −70 to −30 dBm. With the appropriate reference level settings, the two RSAs divide the desired overall system dynamic range into two smaller signal power segments that, when combined, cover the overall system level dynamic range needs.

The two RSAs 108, 110 independently create different digital acquisitions of the RF signal dynamic range segments. Both of these segments are simultaneously recorded and pre-processed by the recorder 112 to provide, for each segment, coarse PDW pulse parameters.

The recorded signal I&Q information from each channel is then compared in the workstation 114 to determine which channel has the highest quality for each individual pulse. For example, if a signal has a power of −10 dBm, the higher power range channel would have valid data, while the lower power range channel would be in saturation and its data would be invalid. In this case, software in the workstation 114 would delete the invalid or poor quality data and include only the good quality I&Q information in the pulse signal file to be used for subsequent PDW detailed analysis and inclusion in the final recorded I&Q signal file.

The effect of this approach is to create a system that can have combined dynamic range and RF instantaneous bandwidth that exceeds that which is theoretically possible based on the laws of physics and individual component capabilities.

The selection of the optimum dynamic range segment from the available multiple recorded signal files is done by the system 100 automatically. This can be performed on a pulse-by-pulse segment of the recorded signal, or on another short-duration modulation segment of the recorded signal basis, if appropriate. The speed of transition from optimum segment to optimum segment could be on the order of a few microseconds or shorter, if appropriate. Individual recorded digital signal representations from each of the receiving, sampling and recording systems may contain a power reference level, over-range condition flags, and other information needed to allow the subsequent source selection to be done. An overview of processing performed by the recorder 112, and by the workstation 114, which provides the means for selecting from and combining the RF stream recordings to provide a final contiguous and faithful RF stream recording having the highest quality signal based on a quality threshold applied to both RF stream recordings, is provided in Table 1.

TABLE 1

Processing Overview

STEP

1. Process Next Series of I/Q Pulse Data
2. Determine Whether Digitizer is Over-Range
3. Calculate Power Measurements Extracted from the Pulse Data
4. Calculate Timing Measurements
5. Select Best Pulse Data Results
6. Store Parameters to PDW or Other File
7. Repeat Process Beginning at Step 1

Figure 16:
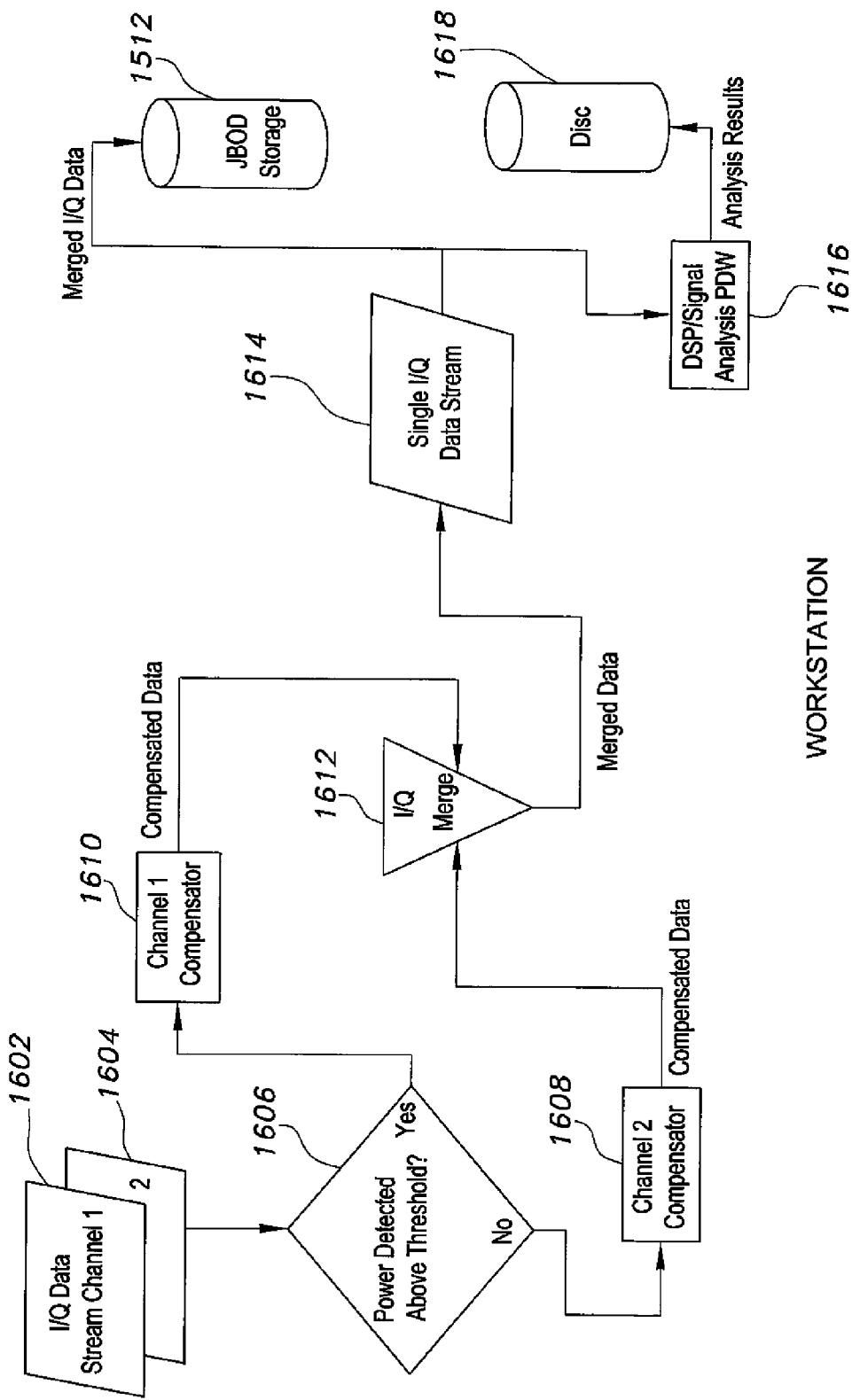
FIG. 16 is a flowchart/block diagram showing steps and system components used to merge the spectra from two spectrum analyzers an enhanced dynamic range RF pulse measurement system according to the present invention.

As illustrated in FIG. 16, I/Q data stream channels (e.g., stream channel 1 1602 and stream channel 2 1604) are routed to a power threshold detector 1606. If the power detected is above a threshold, the data is fed to a channel 1 compensator 1610. If the power detected is below a threshold, the data is fed to a channel 2 compensator 1608. A data merger 1612 merges the channel 1 compensated and channel 2 compensated I/Q data, and the merged data is processed as a single I/Q data stream 1614. The single I/Q data stream 1614 is then routed to a merged I/Q data storage 1512 and to a DSP/Signal Analysis PDW process 1616, where the analysis results are stored on an analysis results storage device 1618.

As an alternative to the RSA implementation, broadband tuners and high speed analog-to-digital converters (ADCs) may be used to create the digitized RF signal stream that is subsequently recorded and available for selection and use.

In yet a further embodiment, a mixture of spectrum analyzers and tuner-ADC devices may be used in order to cover a desired frequency range, bandwidth, and dynamic range.

For signals of interest that include RF pulse waveforms, such as radar and radar-like signals, the integrated digitized RF data stream can be processed using digital signal processing methods to determine such pulse parameters as rise/fall times, peak power, average power, duration, repetition rate, inter-pulse frequency variations, or other modulations, etc. This analysis can be done using high-speed Field Programmable Gate Array (FPGA) circuits, General Purpose Graphic Processing Unit (GPGPU) processors, general purpose processors with software, or other methods.

When high speed digitizers are used to acquire rapidly changing wide bandwidth signals, filtering must often be minimized in order to avoid altering the characteristics of the waveforms. Minimal filtering means that noise power is not suppressed, and without good signal-to-noise ratios, measurements become distorted and unusable.

Receiver, digitizer and recording systems must be capable of operating without damage and quickly recovering from the effects of being presented with signal levels that are above the highest signal levels that the particular unit may be optimized for. For example, systems having reference levels set for low level signals will be saturated and operating in an over-range condition when input signal levels are higher than the expected low level signals. Amplifiers, digitizers and other RF signal processing elements must not be damaged and must be able to recover normal operation very rapidly. In addition, when operating in a saturated or over-range condition, the associated recorded RF signal information must be flagged, marked, or otherwise have the capability for the subsequent source selection process to determine that the data is not valid and eliminate it from subsequent processing.

Each of the receiver, digitizer and recording system must be configured such that they provide high quality recorded signal data from near the top end of the channel's dynamic range to a point that is at or below the top end of the dynamic range of the next lower power segment receiver, digitizer and recording system. The fact that a given system's digitizer is near or at saturation, or alternatively, has a signal-to-noise ratio that is too low for signal processing, or alternatively, when some other decision criterion is met, can be used as a criterion to determine a desirable transition point between the different dynamic range segments.

Having duplicate receiver, digitizer and recording systems can the double dynamic range of the entire system. Having triplicate receiver, digitizer and recording systems can triple the dynamic range, and the like. Thus, the effective dynamic range over which the combined system is capable of making accurate RF measurements is proportional to the number of recording streams created by the system.

Each Spectrum Analyzer, such as RSA 1 108 and RSA 2 110, can have an individual associated lookup table or other compensation approach to account for path losses, A/D non-linearity, frequency compensation, and other calibration data. This compensation can be done in real time, or can be done in non-real time by post-processing.

The recorded RF data files from all receiver/digitizers must be stored and analyzed simultaneously so that the optimum data set is used for the analysis of each pulse or other signal modulation element. After each pulse or modulation element has been analyzed, the pulse descriptor word (PDW) or other digital representation of the signal can be concatenated to create a single combined file that contains results that would be the same as if a single system with both the desired high RF dynamic range and large RF analysis bandwidth existed, even though such a combination of capabilities might be beyond that which is practically or theoretically possible.

Figure 2:
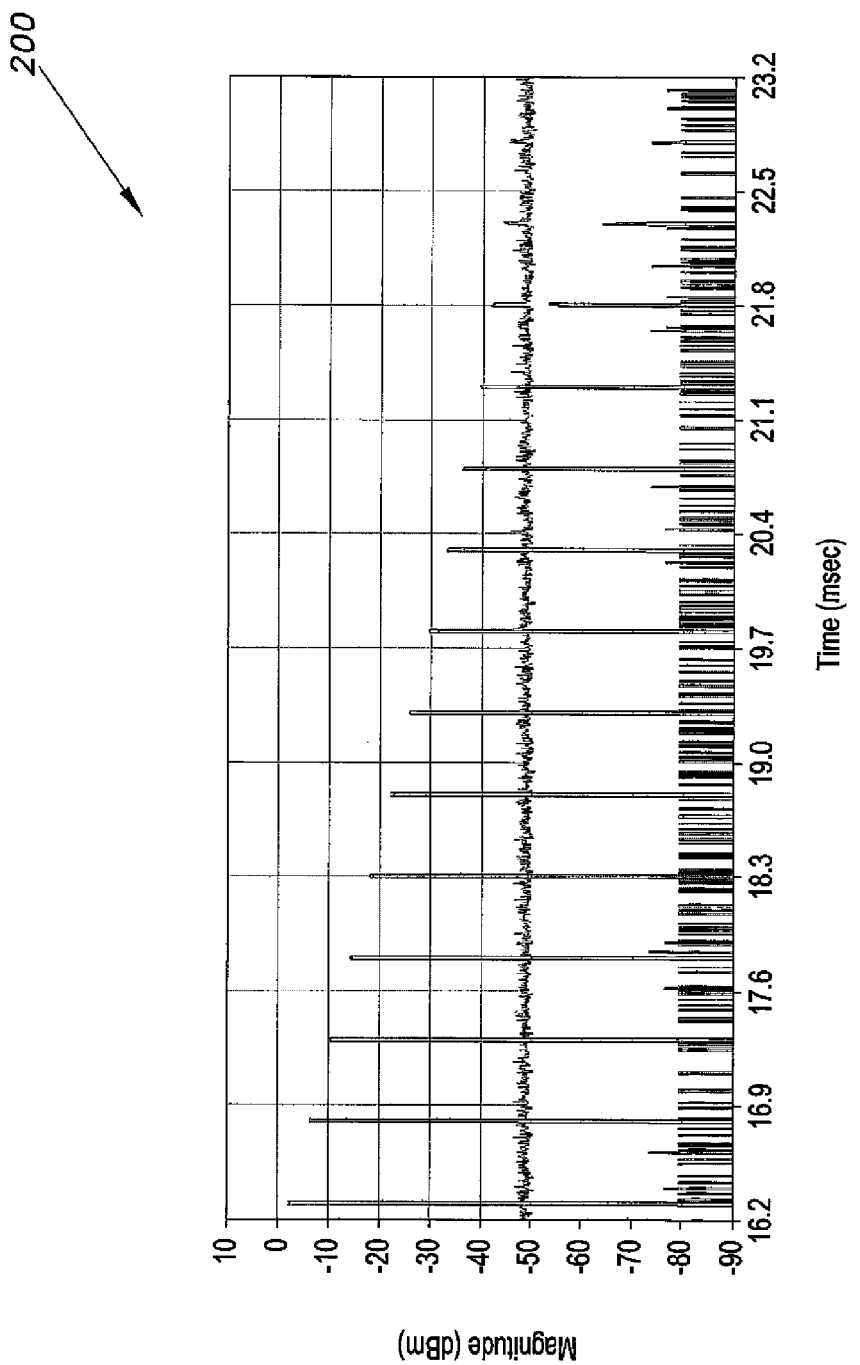
FIG. 2 is an RF spectrum as shown in a screen capture on a spectrum analyzer set to measure, without clipping, the pulses containing the highest power levels.
Figure 3:
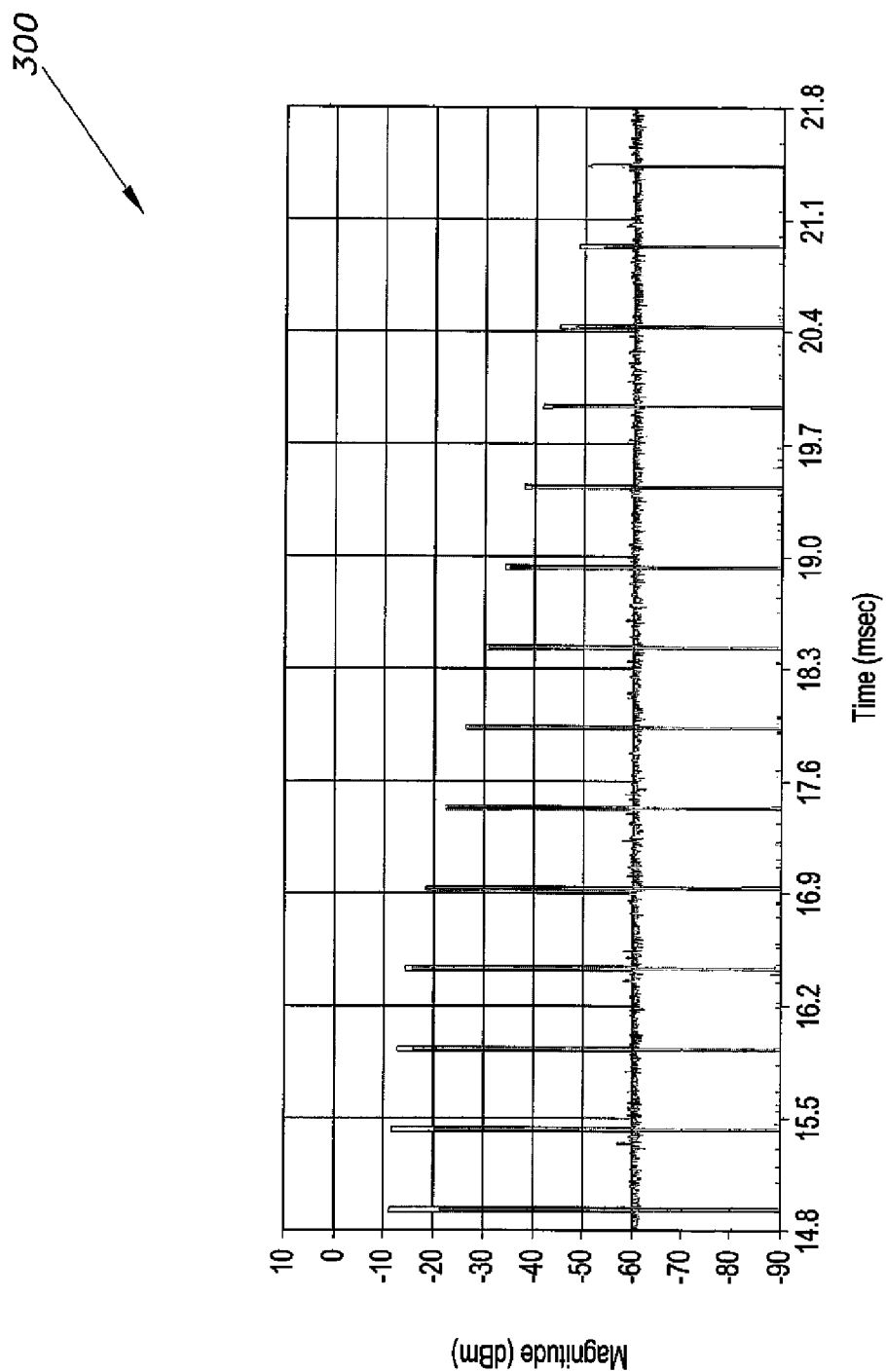
FIG. 3 is an RF spectrum as shown in a screen capture on a spectrum analyzer set to measure low power pulses, while allowing the high power pulses to be clipped by the A/D (analog-to-digital) limiter of the same series of pulses applied to the spectrum analyzer in FIG. 2.
Figure 13:
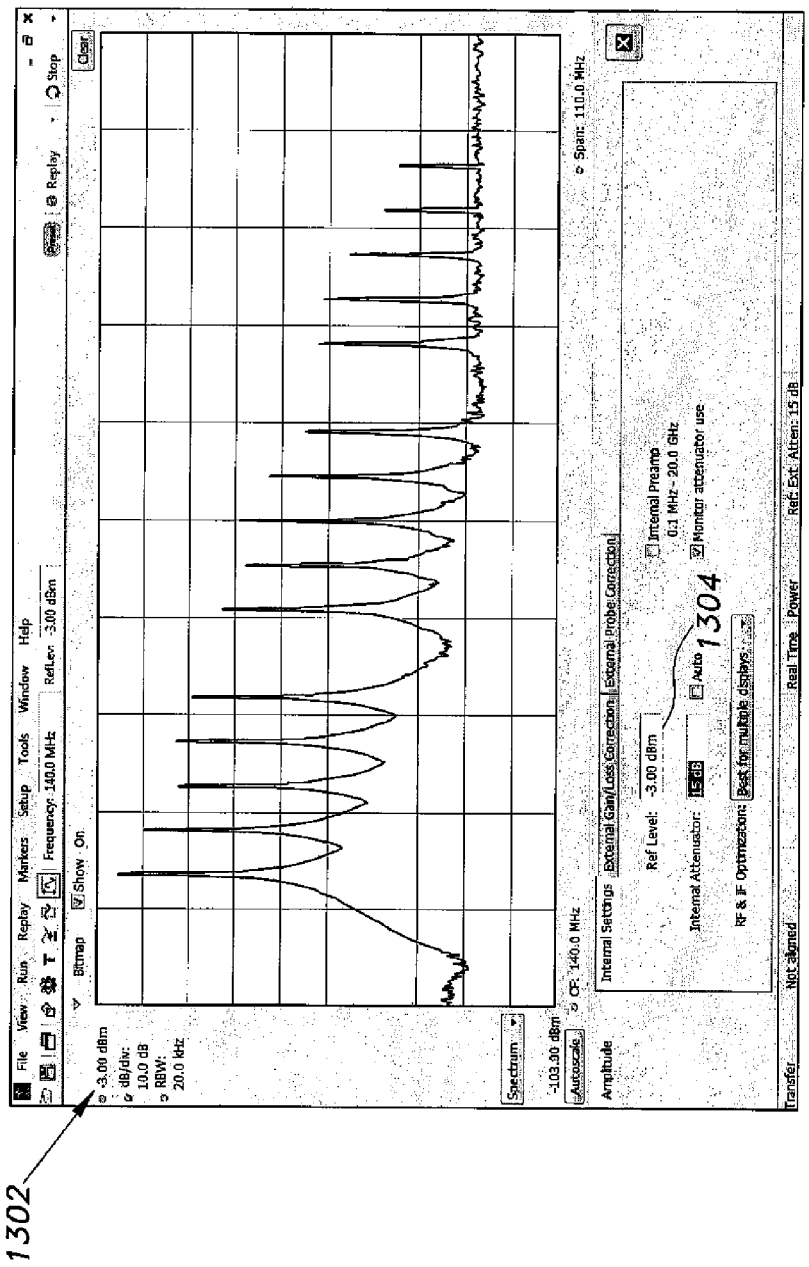
FIG. 13 is a screenshot showing settings of the highest power level measuring spectrum analyzer in an enhanced dynamic range RF pulse measurement system according to the present invention.
Figure 14:
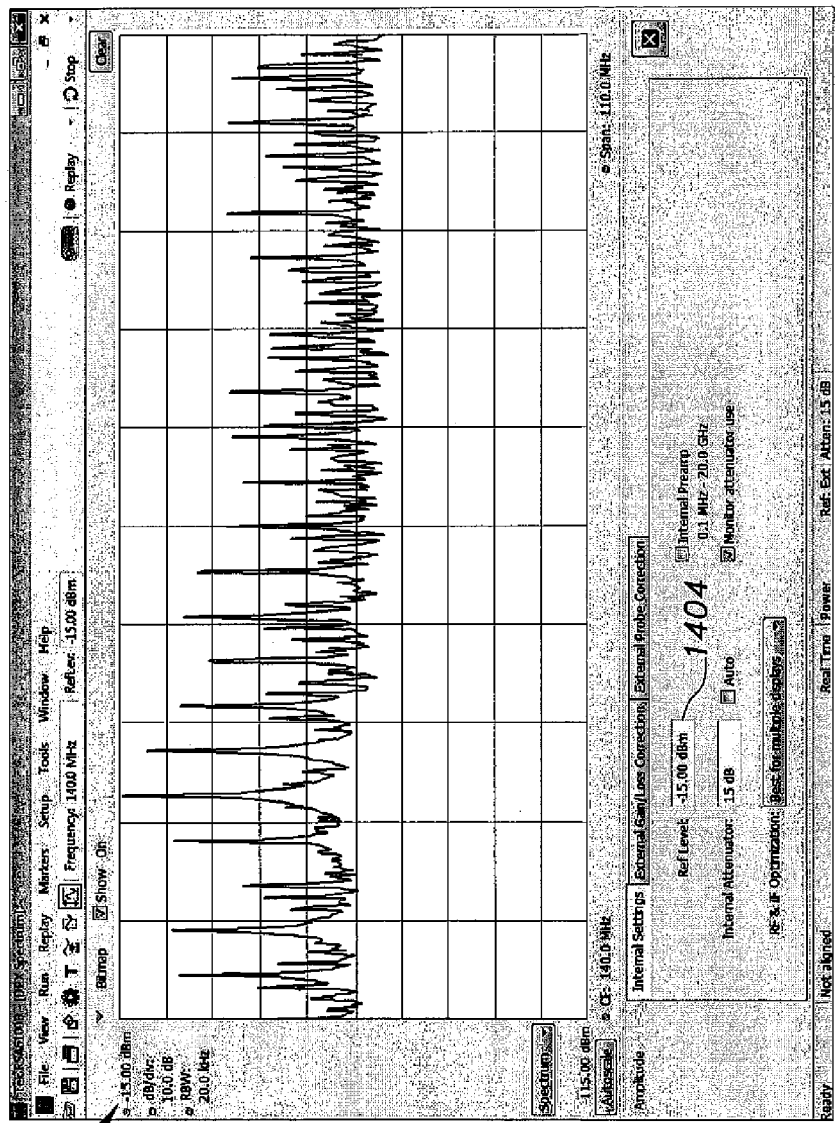
FIG. 14 is a screenshot showing settings of the lowest power level measuring spectrum analyzer in an enhanced dynamic range RF pulse measurement system according to the present invention.

To illustrate the process, the same series of pulses as shown in FIGS. 2 and 3 are sent to two identical spectrum analyzers. The pulses decrement in power over time and are captured by both spectrum analyzers. The capture 200 shown in FIG. 2 is from the spectrum analyzer set to measure, without clipping, the pulses containing the highest power levels, i.e., RSA 1 108. The settings of RSA 1 108 are shown in screenshot 1300 of FIG. 13, where it is seen that the reference level entry 1304 is set to −3.00 dBm and confirmed by reference level display 1302. The capture 300 shown in FIG. 3 is from the spectrum analyzer set to measure low power pulses (RSA 2 110) while allowing the high power pulses to be clipped by the A/D limiter. The setting of RSA 2 110 is shown in screenshot 1400, where it is seen that the reference level entry 1404 is set to −15.00 dBm and confirmed by reference level display 1402. Referring again to FIG. 2, notice the higher noise floor in the high range capture 200. Also, referring to FIG. 3, notice the additional power to noise range of the low level pulses on the capture 300, and the fact that the first four pulses are clipped, making them unsuitable for making accurate power measurements.

Figure 4:
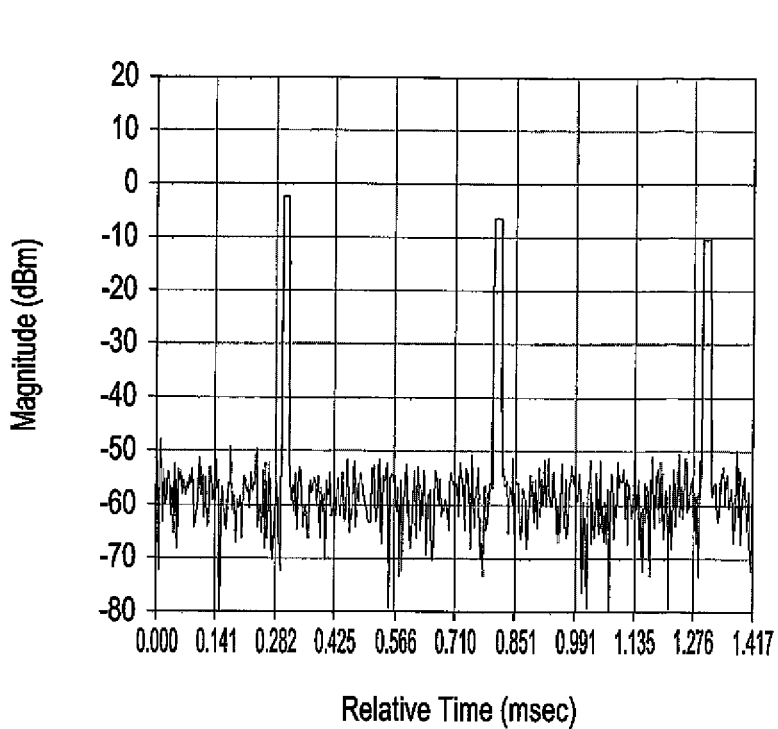
FIG. 4 is a zoom-in screen capture of the RF spectrum of FIG. 2, showing high power pulse capture without overranging the A/D.
Figure 5:
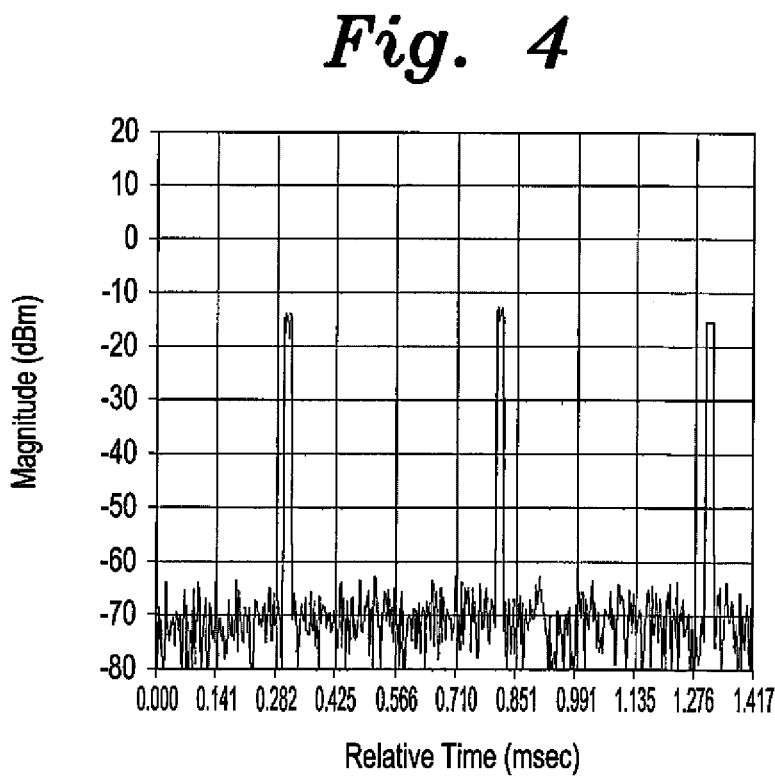
FIG. 5 is a zoom-in screen capture of the RF spectrum of FIG. 3, showing the same pulses being clipped by the A/D limiter.

By zooming in, we can see in capture 400 of FIG. 4 that the high power pulses are captured without over ranging the A/D, while the same pulses, shown in capture 500 of FIG. 5, are clipped by the A/D limiter. The results from capture 400 are used for measuring high power pulses, but notice the lower noise floor from capture 500 when the A/D levels are optimized for lower power pulses.

Figure 6:
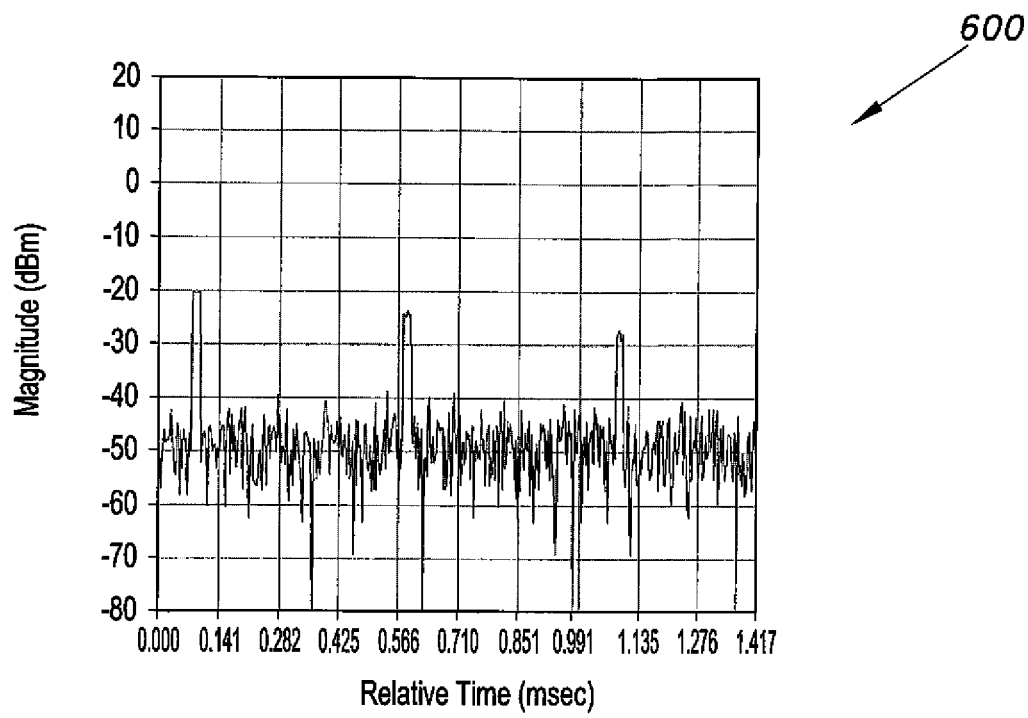
FIG. 6 is an RF spectrum as shown in a screen capture on a spectrum analyzer set to measure, without clipping, the pulses containing the highest power levels in an enhanced dynamic range RF pulse measurement system according to the present invention, showing medium power pulse capture without over ranging the A/D.
Figure 7:
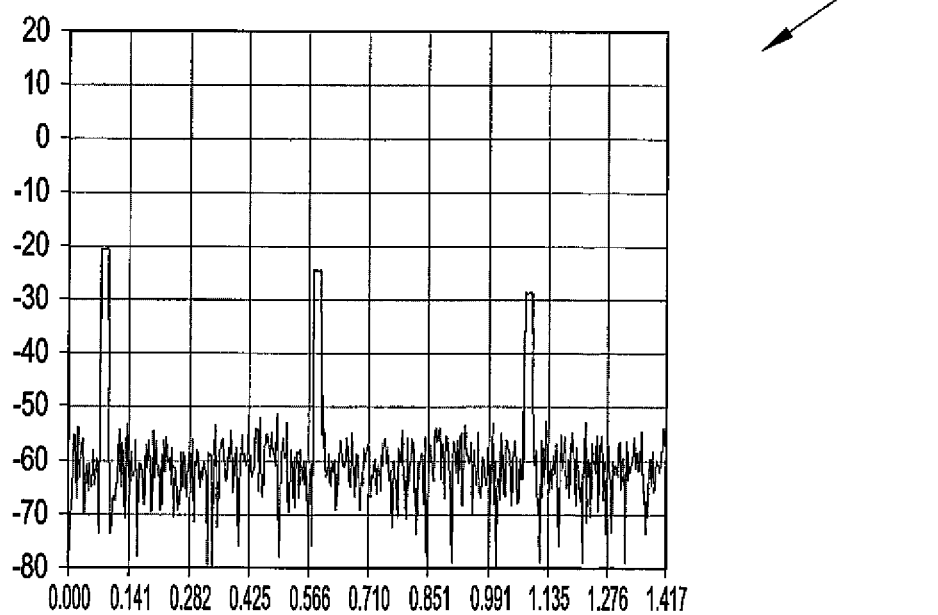
FIG. 7 is an RF spectrum as shown in a screen capture on a spectrum analyzer set to measure low power pulses, while allowing the high power pulses to be clipped by the A/D (analog-to-digital) limiter of the same series of pulses applied to the spectrum analyzer in FIG. 6, showing the medium power pulse capture without over ranging the A/D, but showing better S/N (signal-to-noise) ratio, i.e., a lower noise floor.

The same signal captured by both spectrum analyzers, as shown in capture 600 of FIG. 6 and capture 700 of FIG. 7, shows that when the pulse power levels are in the midrange and neither capture is clipped, capture 700 with the lower noise floor is used to give the most accurate results.

Figure 8:
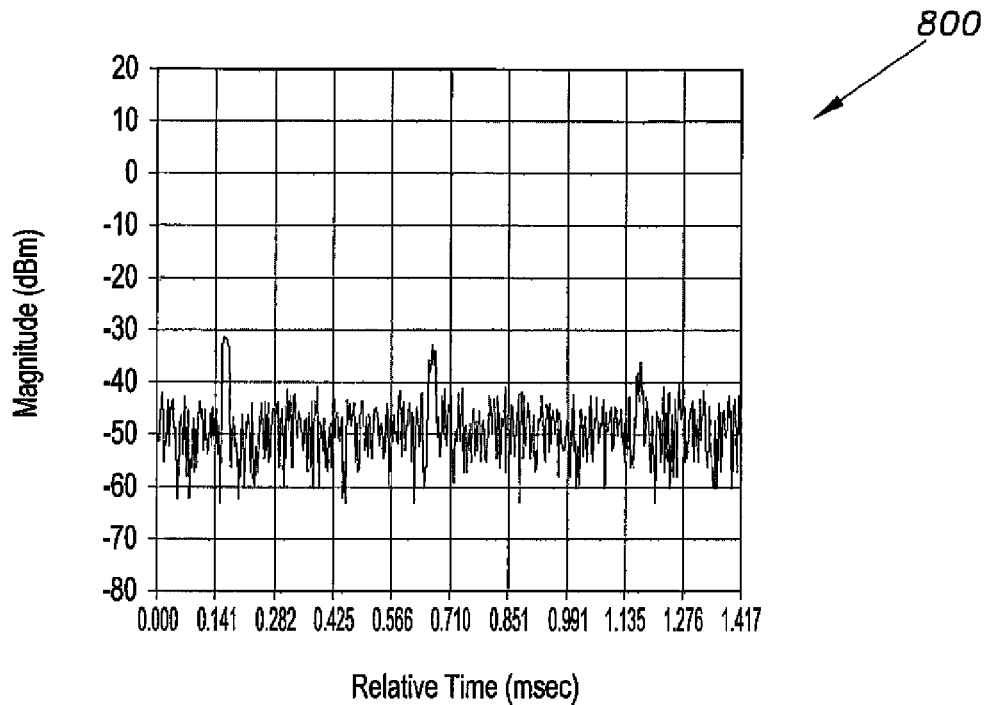
FIG. 8 is an RF spectrum as shown in a screen capture on a spectrum analyzer set to measure, without clipping, the pulses containing the highest power levels in an enhanced dynamic range RF pulse measurement system according to the present invention, showing a lower power pulse train that is hard to measure accurately, since the noise floor is high.
Figure 9:
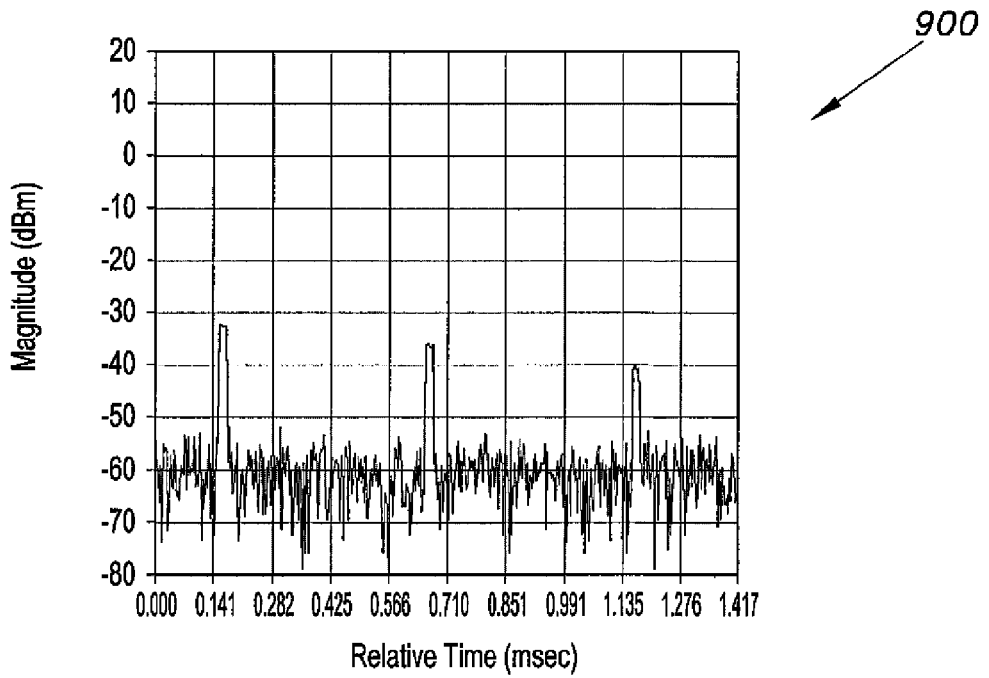
FIG. 9 is an RF spectrum as shown in a screen capture on a spectrum analyzer set to measure low power pulses, while allowing the high power pulses to be clipped by the A/D (analog-to-digital) limiter in an enhanced dynamic range RF pulse measurement system according to the present invention of the same series of pulses applied to the spectrum analyzer in FIG. 8, showing that the lower power pulse train is easier to measure accurately due to the lower noise floor.

Utilizing the same input signal to both spectrum analyzers 108 and 110, the lower power pulses of capture 800 in FIG. 8 are harder to measure accurately, since the noise floor is much higher than the same pulses of capture 900 in FIG. 9, where the A/D input levels are set for lower power pulses. The final measurement results would use only the information from capture 900 for measuring low power pulses.

Figure 10:
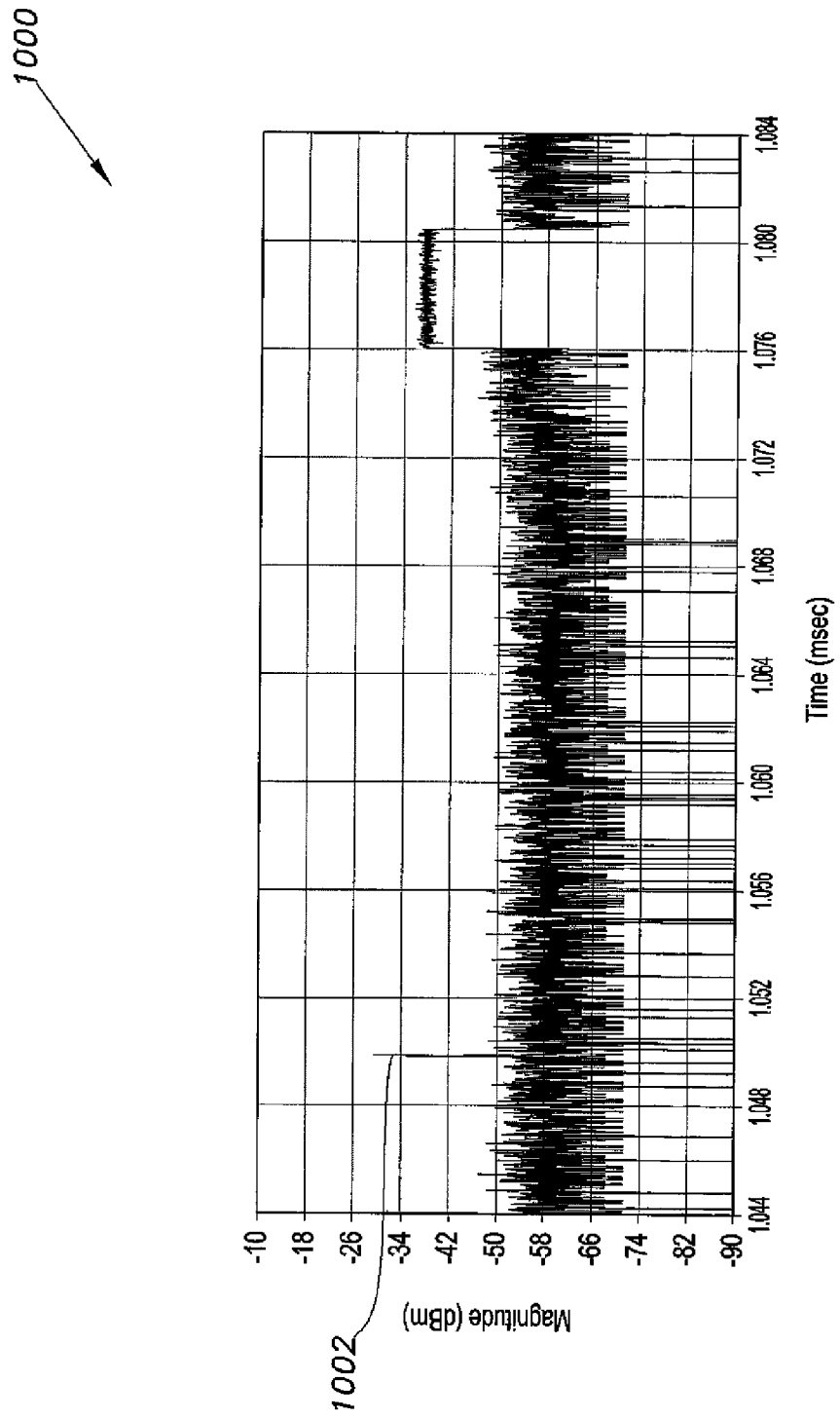
FIG. 10 is an RF spectrum as shown in a screen capture on a spectrum analyzer, having an impulse as shown by the spike, which is input into both spectrum analyzers in an enhanced dynamic range RF pulse measurement system according to the present invention to provide absolute timing accuracy.
Figure 11:
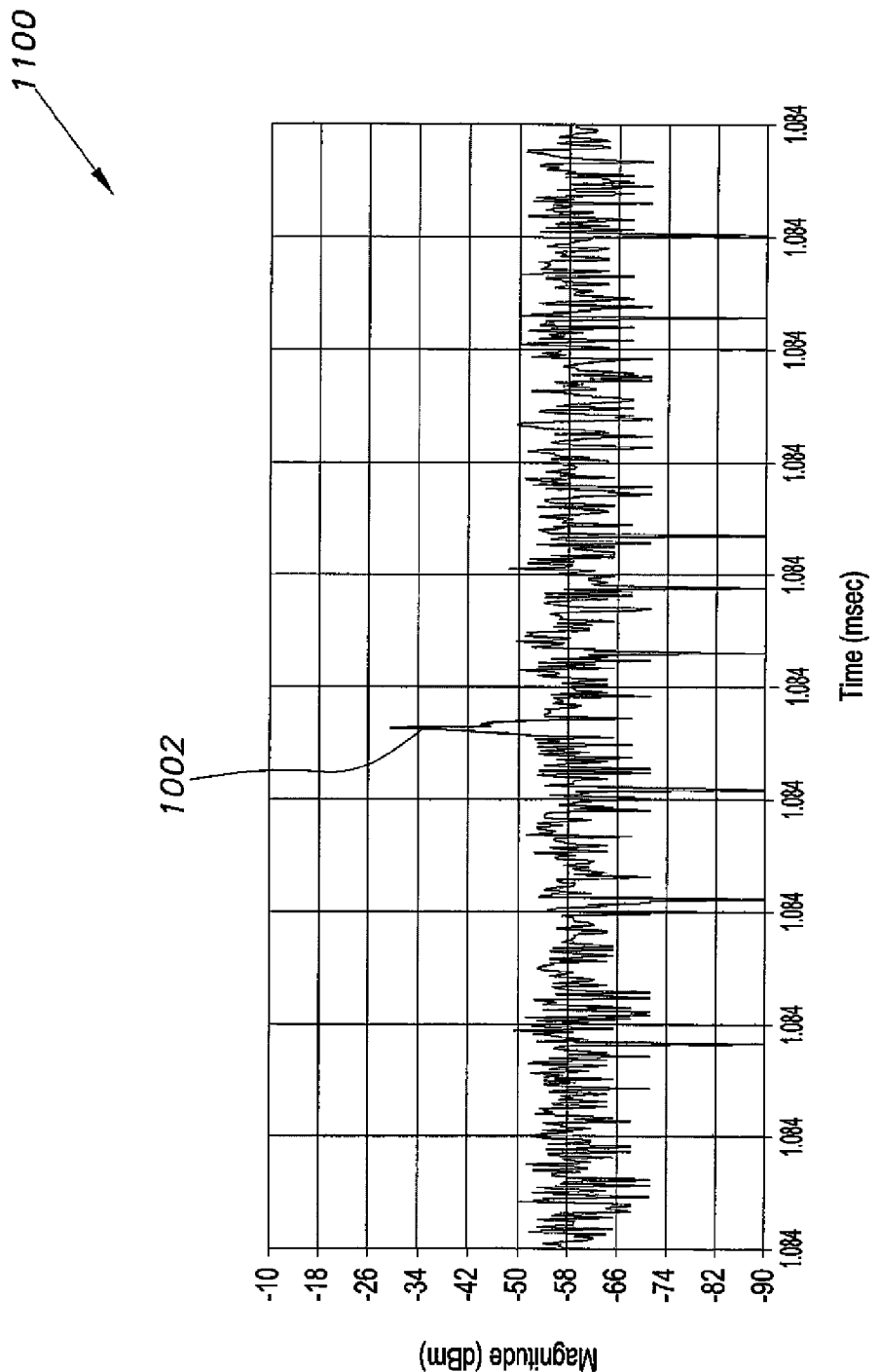
FIG. 11 is a zoom-in screen capture of the RF spectrum of FIG. 10.

In addition to phase-locking both analyzers 108 and 110 together to provide timing accuracy, an impulse, as shown by the spike 1002 in FIG. 10, is input into both spectrum analyzers to provide absolute timing accuracy. The impulse is generated by an accurate global positioning signal (GPS) time standard that outputs a precision one pulse per second (1 PPS) timing mark every second. This timing mark is recorded in both systems to an accuracy of a single A/D sample point and ensures that timing measurements on both spectrum analyzers are synchronized. The timing mark provides an absolute time zero indication and is used by both systems to ensure precision time measurements, while providing the means for time synchronization of workstation processing with the recorders and the precision timing pulse insertion units. The zoomed in view in FIG. 11 shows the 1 pps timing mark 1002 after being recorded in the data. The screenshot 1200 of FIG. 12 shows typical pulse descriptor word (PDW) measurements on the RF pulse data as processed by workstation 114.

It is to be understood that the present invention is not limited to the embodiments described above, but encompasses any and all embodiments within the scope of the following claims.

We claim:

1. An enhanced dynamic range RF (radio frequency) pulse measurement system, comprising:
    an RF splitter having an input terminal adapted for receiving an RF signal and having at least two output terminals, the splitter having a circuit for splitting the received RF signal into identical copies of the received RF signal at the output terminals;
    a first RF receiver operably connected to the RF splitter for receiving a first copy of the received RF signal, the first RF receiver having a reference signal strength set to process the received RF signal within a first dynamic power range;
    a second RF receiver operably connected to the RF splitter for receiving a second copy of the received RF signal, the second RF receiver having a reference signal strength set to process the received RF signal within a second dynamic power range;
    a first RF stream recorder operably connected to the first RF receiver, the first RF stream recorder having means for making a first recording of the RF signal processed within the first dynamic power range by the first RF receiver;
    a second RF stream recorder operably connected to the second RF receiver, the second RF stream recorder having means for making a second recording of the RF signal processed within the second dynamic power range by the second RF receiver; and
    means for selecting from and combining segments of the first recording and the second recording to provide a noise-free representation of the received RF signal over a wide dynamic power range and a wide RF bandwidth.

2. The enhanced dynamic range RF pulse measurement system according to claim 1, further comprising a first precision timing pulse insertion unit connected between the RF splitter and the first RF receiver, the first precision timing pulse insertion unit having an input that periodically injects a precision timing pulse into the first copy of the received RF signal before the signal is recorded by said first RF stream recorder.

3. The enhanced dynamic range RF pulse measurement system according to claim 2, further comprising a second precision timing pulse insertion unit connected between the RF splitter and the second RF receiver, the second precision timing pulse insertion unit having an input that periodically injects a precision timing pulse into the second copy of the received RE signal before the signal is recorded by said second RE stream recorder.

4. The enhanced dynamic range RF pulse measurement system according to claim 2, wherein said means for selecting from and combining said first and said second RF stream recordings comprises means for utilizing in-phase (I) and quadrature (Q) information from said first and second RF stream recordings in combination with a quality threshold to select the processed RF signal copy having the highest quality representation of the received RF signal.

5. The enhanced dynamic range RF pulse measurement system according to claim 4, wherein said means for selecting from and combining said first and said second RF stream recordings further comprises means for time synchronization between said recorders and said first and second precision timing pulse insertion units.

6. The enhanced dynamic range RF pulse measurement system according to claim 2, wherein said first and second RF receivers comprise a pair of real-time spectrum analyzers (RSAs).

7. The enhanced dynamic range RF pulse measurement system according to claim 2, wherein the reference signal strength setting of the first RF receiver and the reference signal strength setting of the second RF receiver provide a combined dynamic range having overlap between the first RF receiver's dynamic range and the second RF receiver's dynamic range.

8. The enhanced dynamic range RF pulse measurement system according to claim 2, wherein noise-free representation of the received RF signal comprises a file containing a plurality of pulse descriptor words describing radar data captured by said first and second RF stream recorders.

9. The enhanced dynamic range RF pulse measurement system according to claim 2, wherein the precision timing pulse includes an IRIG-B modulated carrier.

10. A computer software product, comprising a non-transitory medium readable by a processor, the non-transitory medium having stored thereon a set of instructions for enhancing the dynamic range of RF pulse measurements in an enhanced dynamic range RF pulse measurement system, the set of instructions including:
  (a) a first sequence of instructions which, when executed by the processor, causes said processor to accept as input a first digitized and time tagged RF stream recording and a second digitized and time tagged RF stream recording, said first and second stream recordings being recordings of a same RF stream at different dynamic range settings;
  (b) a second sequence of instructions which, when executed by the processor, causes said processor to determine whether the first or second digitized and time tagged RF stream recordings exhibits an over-range, degraded signal;
  (c) a third sequence of instructions which, when executed by the processor, causes said processor to calculate power measurements of the first and second digitized and time tagged RF stream recordings at a given time based on time tags in the digitized and time tagged RF stream recordings;
  (d) a fourth sequence of instructions which, when executed by the processor, causes said processor to calculate timing measurements of the first and second digitized and time tagged RF stream recordings;
  (e) a fifth sequence of instructions which, when executed by the processor, causes said processor to select from said first and second digitized and time tagged RF stream recordings a best RF data representing a non-over range and lowest noise floor signal; and
  (f) a sixth sequence of instructions which, when executed by the processor, causes said processor to store said best RF data in a data file.

11. The computer software product according to claim 10, wherein the different dynamic range settings are overlapping.

12. The computer software product according to claim 10, wherein the data file is composed of a plurality of pulse descriptor words describing radar data captured by said first and second digitized and time tagged RF stream recordings.

13. The computer software product according to claim 12, further comprising:
  a seventh sequence of instructions which, when executed by the processor, causes said processor to store and maintain said plurality of pulse descriptor words in said data file in sequential order as they were captured in said first and second digitized and time tagged RF stream recordings.

14. A method for enhanced dynamic range RF (radio frequency) pulse measurement, comprising the steps of:
  receiving an RF signal for spectrum analysis;
  dividing the dynamic range of the received RF signal into a plurality of discrete, overlapping dynamic power ranges;
  splitting the RF signal into multiple copies corresponding to the number of discrete, overlapping dynamic power ranges;
  independently and separately analyzing the spectrum of the multiple copies of the received RF signal to provide multiple spectra of the received RF signal;
  dividing the multiple spectra into an equal number of time segments; and
  combining segments from the multiple spectra to form a composite spectrum analysis representation of the received RF signal, the combining step including:
  for each time segment, discarding segments from spectra where peak power levels are cut off for exceeding the dynamic power range of the spectra and including segments from spectra where peak power levels are shown in the composite spectrum analysis representation; and
  for each time segment, discarding segments from spectra where the RF signal power levels are indistinguishable from noise power levels and including segments from spectra where the RF signal power level is separated from the noise power level.

15. The method for enhanced dynamic range RF (radio frequency) pulse measurement according to claim 14, further comprising the step of injecting reference time signals into the multiple copies of the received RF signal in order to time synchronize the spectra of the multiple copies.

* * * * *